(12) United States Patent
Jeung et al.

(10) Patent No.: US 7,075,809 B2
(45) Date of Patent: Jul. 11, 2006

(54) MEMORY CELL STRUCTURE OF METAL PROGRAMMABLE READ ONLY MEMORY HAVING BIT CELLS WITH A SHARED TRANSISTOR CELL

(75) Inventors: Seong-ho Jeung, Suwon (KR); Young-keun Lee, Anyang (KR); Yong-jae Choo, Seoul (KR); Young-sook Do, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/869,386

(22) Filed: Jun. 16, 2004

(65) Prior Publication Data
US 2005/0018465 A1    Jan. 27, 2005

Related U.S. Application Data

(62) Division of application No. 10/085,367, filed on Feb. 28, 2002, now Pat. No. 6,771,528.

(30) Foreign Application Priority Data
May 31, 2001    (KR) .............................. 2001-30523

(51) Int. Cl.
*G11C 17/00* (2006.01)
(52) U.S. Cl. ............................ 365/94; 365/63; 365/72; 365/103; 365/104
(58) Field of Classification Search ................. 365/94, 365/63, 72, 103, 104
See application file for complete search history.

(56) References Cited

U.S. PATENT DOCUMENTS

| | | | | |
|---|---|---|---|---|
| 4,563,753 A | * | 1/1986 | Donoghue | 365/104 |
| 4,811,301 A | * | 3/1989 | Houston | 365/203 |
| 4,888,734 A | * | 12/1989 | Lee et al. | 365/185.02 |
| 5,117,389 A | * | 5/1992 | Yiu | 365/104 |
| 5,295,092 A | * | 3/1994 | Hotta | 365/51 |
| 5,359,555 A | * | 10/1994 | Salter, III | 385/185 |
| 5,399,891 A | * | 3/1995 | Yiu | 257/316 |

(Continued)

FOREIGN PATENT DOCUMENTS

JP    405198775 A    *    8/1993

(Continued)

OTHER PUBLICATIONS

Notice to Submit Response, Korean Application No. 10-2001-0030523, May 30, 2003.

*Primary Examiner*—Viet Q. Nguyen
(74) *Attorney, Agent, or Firm*—Myers Bigel Sibley & Sajovec, P.A.

(57) ABSTRACT

A memory cell structure of a metal (or via) programmable ROM whereby a transistor is shared between bit cells of the programmable ROM. Such a memory cell structure may include: a word line; a bit line; first and second virtual grounding lines; a grounding line; a first bit cell selected by signals of the word line and the first virtual grounding line; and a second bit cell selected by signals of the word line and the second virtual grounding line, wherein a cell transistor, one side of which is connected to the bit line is shared both by the first and second bit cells. Also, the other side of the cell transistor may be floated or connected to the bit line or, alternatively, connected to any one of the first virtual grounding line, the second virtual grounding line and the grounding line, and the gate of the cell transistor is connected to the word line.

3 Claims, 4 Drawing Sheets

U.S. PATENT DOCUMENTS

| | | | |
|---|---|---|---|
| 5,414,658 A * | 5/1995 | Challa | 365/185 |
| 5,436,478 A * | 7/1995 | Bergemont | 257/316 |
| 5,572,462 A * | 11/1996 | Lee | 365/168 |
| 5,590,068 A * | 12/1996 | Bergemont | 365/63 |
| 5,633,185 A * | 5/1997 | Yiu et al. | 438/258 |
| 5,650,979 A * | 7/1997 | Komarek et al. | 365/233.5 |
| 5,663,903 A * | 9/1997 | Guo | 365/104 |
| 5,680,343 A * | 10/1997 | Kamaya | 365/104 |
| 5,684,733 A * | 11/1997 | Wu et al. | 365/100 |
| 5,862,076 A * | 1/1999 | Eitan | 365/185.16 |
| 6,084,794 A * | 7/2000 | Lu et al. | 365/104 |
| 6,175,519 B1 * | 1/2001 | Lu et al. | 365/185.02 |
| 6,204,541 B1 | 3/2001 | Togami et al. | 257/390 |
| 6,214,669 B1 | 4/2001 | Hisamune | 438/259 |
| 6,459,119 B1 | 10/2002 | Huang et al. | 257/314 |
| 6,531,393 B1 | 3/2003 | Huang et al. | 438/655 |
| 6,531,735 B1 * | 3/2003 | Kamigaki et al. | 257/324 |
| 6,570,810 B1 | 5/2003 | Wang | 365/230.03 |
| 6,633,496 B1 | 10/2003 | Maayan et al. | 365/63 |
| 6,653,685 B1 | 11/2003 | Katayama et al. | 257/324 |
| 6,674,661 B1 | 1/2004 | Becker | 365/104 |
| 6,771,528 B1 * | 8/2004 | Jeung et al. | 365/94 |
| 6,861,714 B1 * | 3/2005 | Lee et al. | 257/390 |
| 2002/0179999 A1 | 12/2002 | Lee et al. | 257/530 |

FOREIGN PATENT DOCUMENTS

JP     WO009418703 A1 *    8/1994

* cited by examiner

MEMORY CELL STRUCTURE OF METAL PROGRAMMABLE READ ONLY MEMORY HAVING BIT CELLS WITH A SHARED TRANSISTOR CELL

RELATED APPLICATIONS

This application claims priority to and is a divisional of parent application Ser. No. 10/085,367, filed Feb. 28, 2002, now U.S. Pat. No. 6,771,528 which claims the benefit of Korean Patent Application No. 2001-30523, filed May 31, 2001, the disclosures of which are hereby incorporated herein by reference.

FIELD OF THE INVENTION

The present invention relates to a semiconductor memory devices and more particularly, to memory cell structures of metal programmable read only memories (ROMs).

BACKGROUND OF THE INVENTION

A Mask Read Only Memory (Mask ROM) is a semiconductor memory device in which data required is coded during a manufacturing process. There are, generally, two types of Mask ROMs: an embedded diffusion-programmable ROM and an embedded metal programmable ROM. Whether a mask ROM is an embedded diffusion-programmable ROM or an embedded metal programmable ROM, depends on the manufacturing process. Specifically, in the case of the embedded diffusion programmable ROM, its ROM data is programmed during a diffusion process, whereas in the case of the embedded metal programmable ROM, its ROM data is programmed during a metal/metallization process. Additionally, in an embedded via programmable ROM, which is similar to the embedded metal programmable ROM, its ROM data code is programmed during a via process.

Generally, the embedded diffusion-programmable ROM has been preferred to the embedded metal programmable ROM, mainly because the integration density of the former is typically higher than that of the latter by about from 25% to 35%.

However, compared to the embedded metal programmable ROM, it typically takes more time to manufacture the embedded diffusion-programmable ROM after data is received from a user. Recently, increased interest has been shown in the embedded metal (or via) programmable ROM, not only because the integration density thereof has been largely improved as techniques of manufacturing semiconductors have developed, but also because it is advantageous in terms of "Time-to-Market."

FIG. 1 illustrates a two-column bit memory cell structure of a conventional embedded metal programmable ROM. Referring to FIG. 1, a conventional metal programmable ROM includes first and second word lines WL1 and WL2, first and second bit lines BL1 and BL2, a virtual grounding line VGND and first through fourth NMOS cell transistors n11–n14.

A first side of each of the first through fourth NMOS cell transistors n11–n14 is connected to the virtual grounding line VGND. Also, the gates of the first and third cell transistors n11 and n13 and the gates of the second and fourth cell transistors n12 and n14 are connected to the first word line WL1 and the second word line WL2, respectively.

Referring to FIG. 1, data 0, 1 and data 0, 0 are coded in two bit cells selected by the first word line WL1 and two bit cells selected by the second word line WL2, respectively. When the data 0, 1 is coded in two bit cells selected by the first word line WL1 the second side of the first cell transistor n11 is connected to the first bit line BL1 and the second side of the first cell transistor n13 is floated. On the other hand, when the data 0, 0 is coded in two bit cells selected by the second word line WL2, the second sides of the second cell transistor n12 and the fourth cell transistor n14 are connected to the first bit line BL1 and the second bit line BL2, respectively.

FIG. 2 shows a four-column bit memory structure of a conventional metal programmable ROM. Referring to FIG. 2, the four-column bit memory cell of a conventional metal programmable ROM includes first and second word lines WL1 and WL2, first and second bit lines BL1 and BL2, first to third virtual grounding lines VGND1–VGND3 and first through eighth NMOS cell transistors n21–n28.

A first side of each of the first and second cell transistors n21–n22 is connected to the first virtual grounding line VGND1. A first side of each of the third through sixth NMOS cell transistors n23–n26 and a first side of each of the seventh and eighth cell transistors n27 and n28 are connected to the second virtual grounding line VGND2 and the third virtual grounding line VGND3, respectively.

Further, the first word line WL1 is connected to the gates of the first, third, fifth and seventh cell transistors n21, n23, n25 and n27 and the second word line WL2 is connected to the gates of the second, fourth, sixth and eight cell transistors n22, n24, n26 and n28.

FIG. 2 shows that data 0, 0, 1, 0 and 1, 0, 1, 1 are coded in four bit cells selected by the first word line WL1 and four bit cells selected by the second word line WL2. If data 0, 0, 1, 0 are coded in four bit cells selected by the first word line WL1, the second sides of the first and third cell transistors n21 and n23 are connected to the first bit line BL1, the second side of the fifth cell transistor n25 is floated and the second side of the seventh cell transistor n27 is connected to the second bit line BL2. On the other hand, when data 1, 0, 1, 1 are coded in four bit cells selected by the second word line WL2, the second sides of the second, sixth and eighth cell transistors n22, n26 and n28 are floated and the second side of the fourth cell transistor n24 is connected to the first bit line BL1.

The above-described conventional metal programmable ROMs, however, may have a disadvantage in that the size thereof may be larger than that of a conventional embedded diffusion programmable ROM because diffusion domains that hold a bit line in common are separated from one another. Furthermore, the reading speed may be increased over that of a conventional embedded diffusion programmable ROM due to an increase in the loaded capacitance of a bit line which may also result in an increase in power consumption.

SUMMARY OF THE INVENTION

Embodiments of the present invention provide a memory cell structure of a metal programmable ROM that includes a word line, a bit line, first and second virtual grounding lines and a cell transistor. The cell transistor has a first side connected to the bit line. The cell transistor provides a first bit cell selected by signals of the word line and the first virtual grounding line and a second bit cell selected by signals of the word line and the second virtual grounding line.

In further embodiments of the present invention, a grounding line is also provided. In such embodiments, a second side of the cell transistor is selectively floated or connected to one of the first virtual grounding line, the second virtual grounding line and/or the grounding line, and the gate of the cell transistor is connected to the word line.

In further embodiments of the present invention, a memory cell structure of a metal programmable ROM is provided having first and second word lines, a bit line, a grounding line and first and second virtual grounding lines. A first cell transistor having a drain connected to the bit line and a gate connected to the first word line and a second cell transistor having a drain connected to the bit line and a gate connected to the second word line are also provided.

In such embodiments, a source of the first cell transistor may be floated or connected to one of the first virtual grounding line, the second virtual grounding line and/or the grounding line. Furthermore, a source of the second cell transistor may be floated or connected to one of the first virtual grounding line, the second virtual grounding line and/or the grounding line.

The first cell transistor may be shared by both a first bit cell selected by the first word line and the first virtual grounding line and a second bit cell selected by the first word-line and the second virtual grounding line. Similarly, the second cell transistor may be shared both by a third bit cell selected by the second word line and the first virtual grounding line and a fourth bit cell selected by the second word line and the second virtual grounding line.

In additional embodiments of the present invention, a memory cell structure of a metal programmable ROM is provided having first and second word lines, first and second bit lines, a grounding line and first, second and third virtual grounding lines. A first cell transistor has a drain connected to the first bit line and a gate connected to the first word line. A second cell transistor has a drain connected to the first bit line and a gate connected to the second word line. A third cell transistor has a drain connected to the second bit line and a gate connected to the first word line and a fourth cell transistor has a drain connected to the second bit line and a gate connected to the second word line.

In such embodiments, a source of the first cell transistor may be floated or connected to one of the first virtual grounding line, the second virtual grounding line and/or the grounding line. A source of the second cell transistor may be floated or connected to one of the first virtual grounding line, the second virtual grounding line and/or the grounding line. Furthermore, a source of the third cell transistor may be floated or connected to one of the second virtual grounding line, the third virtual grounding line and/or the grounding line. A source of the fourth cell transistor is floated or connected to one of the second virtual grounding line, the third virtual grounding line and/or the grounding line.

In additional embodiments of the present invention, the first cell transistor is shared both by a bit cell selected by the first word line and the first virtual grounding line and a bit cell selected by the first word line and the second virtual grounding line. Similarly, the second cell transistor may be shared both by a bit cell selected by the second word line and the first virtual grounding line and a bit cell selected by the second word line and the second virtual grounding line. The third cell transistor may be shared both by a bit cell selected by the first word line and the second virtual grounding line and a bit cell selected by the first word line and the third virtual grounding line. The fourth cell transistor may be shared by both a bit cell selected by the second word line and the second virtual grounding line and a bit cell selected by the second word line and the third virtual grounding line.

In still further embodiments of the present invention, a memory cell structure for two bit cells of a programmable ROM is provided. The memory cell structure includes a word line, a bit line, a grounding line, first and second virtual grounding lines and a transistor having a controlling terminal connected to the word line, a first controlled terminal connected to the bit line and a second controlled terminal selectively floated or connected to one of the grounding line, the first virtual grounding line, the second virtual grounding line or the bit line based on a value of data programmed into the two bit cells.

In further embodiments of the present invention, the second controlled terminal of the transistor is floated or connected to the bit line to program both bit values to a first logic value. Alternatively, the second controlled terminal is connected to the grounding line to program both bit values to a second logic value opposite the first logic value. The second controlled terminal may also be connected to the first virtual grounding line to program a value of the first bit cell to the second logic value and the value of the second bit cell to the first logic value or connected to the second virtual grounding line to program a value of the first bit cell to the first logic value and the value of the second bit cell to the second logic value.

The second controlled terminal may be selectively floated or connected by a metal fabrication process. Alternatively, the second controlled terminal may be selectively floated or connected by the selective formation of vias.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE INVENTION

Figure 1:
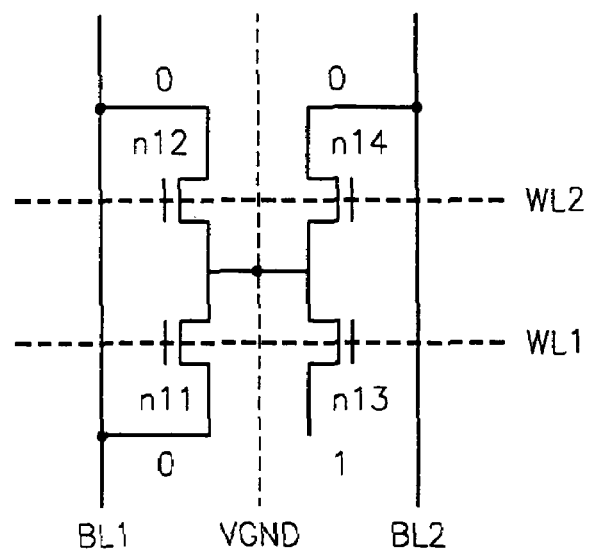
FIG. 1 illustrates a two-column bit memory cell structure of a conventional metal programmable ROM.
Figure 2:
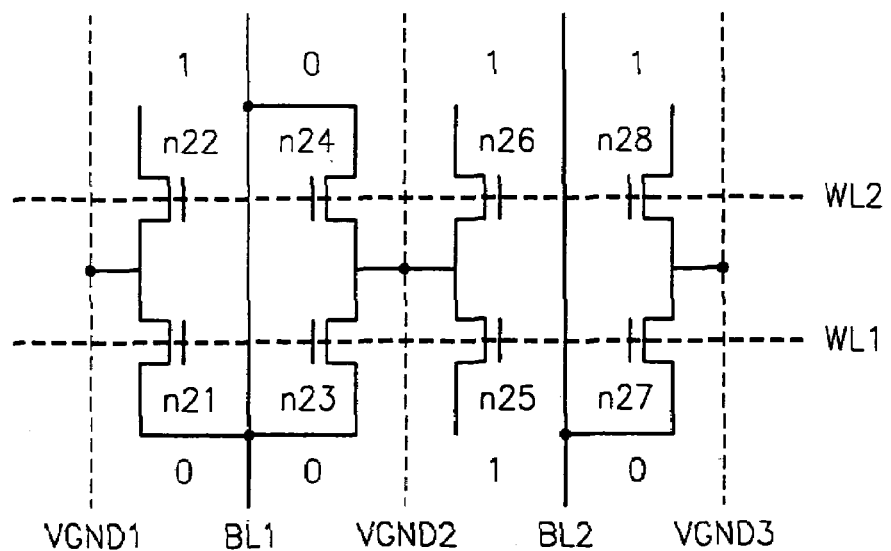
FIG. 2 illustrates a four-column bit memory cell structure of a conventional metal programmable ROM.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

While embodiments of the present invention are described below with reference to nMOS transistors, it will be understood that other types of transistors may be used. Furthermore, the operations and interconnections of the transistors as described with reference to gates, sources and drains but can be other types of controlled and controlling terminals associated with different types of transistors.

Figure 3:
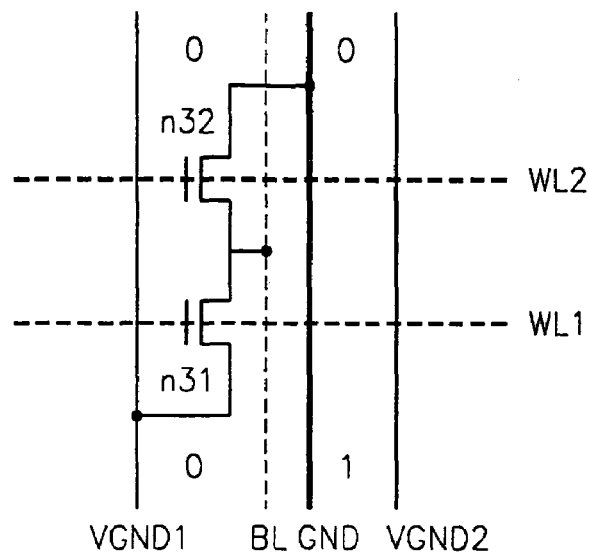
FIGS. 3 through 5 illustrate one-column bit memory cell structures of a metal (or via) programmable ROM according to embodiments of the present invention.
Figure 4:
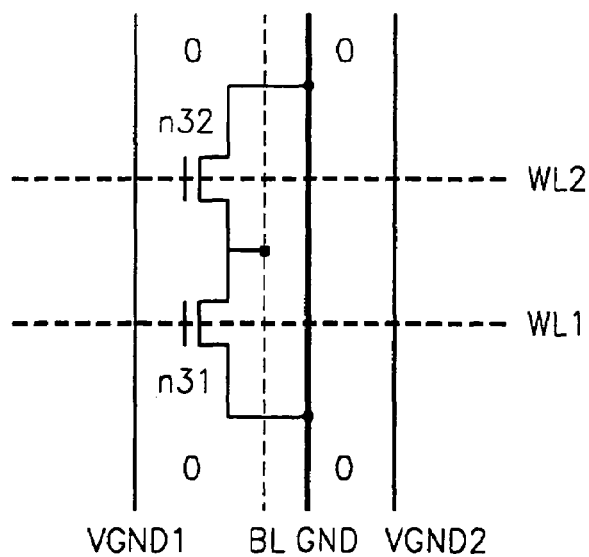
Figure 5:
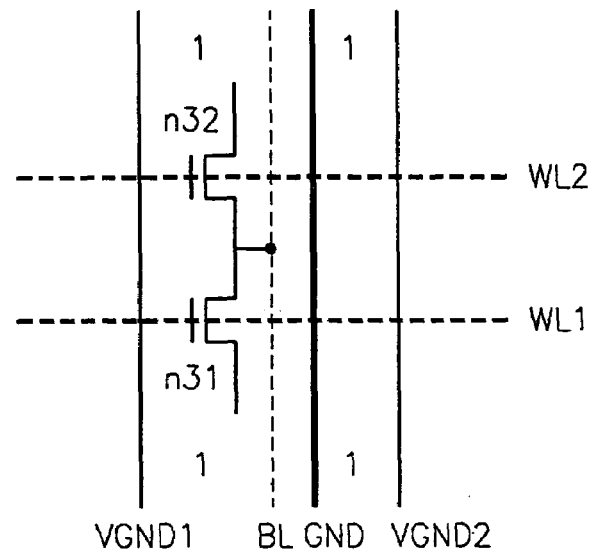

FIGS. 3 through 5 are views of one-column bit memory cell structures of a metal (or via) programmable ROM according to embodiments of the present invention. Referring to FIGS. 3 through 5, the one-column bit memory cell structures of embodiments of the present invention include first and second word lines WL1 and WL2, a bit line BL, first and second virtual grounding lines VGND1 and VGND2, a grounding line GND and first and second NMOS cell transistors n31 and n32.

The drain and gate of the first cell transistor n31 are connected to the bit line BL and the first word line WL1, respectively, whereas the drain and gate of the second cell transistor n32 are connected to the bit line BL and the second word line WL2, respectively.

The source of the first cell transistor n31 is floated or, alternatively, connected to any one of the first virtual grounding line VGND1, the second virtual grounding line VGND2 and/or the grounding line GND depending on the data coded in continuous two-bit cells selected by the first word line WL1. On the other hand, the source of the second cell transistor n32 is floated or, alternatively, connected to any one of the first virtual grounding line VGND1, the second virtual grounding line VGND2 or the grounding line GND depending on the data coded in contiguous two-bit cells selected by the second word line WL2.

In other words, the first cell transistor n31 is shared by both a bit cell selected by the first word line WL1 and the first virtual grounding line VGND1, and a bit cell selected by the first word line WL1 and the second virtual grounding line VGND2, and second cell transistor n32 is shared by both a bit cell selected by the second word line WL2 and the first virtual grounding line VGND1 and a bit cell selected by the second world line WL2 and the second virtual grounding line VGND2.

FIG. 3 shows a one-column bit memory cell structure of a metal programmable ROM according to embodiments of the present invention, in which data 0, 1 is coded in two adjacent bit cells selected by the first word line WL1, and data 0, 0 are coded in two adjacent bit cells selected by the second word line WL2. When data 0, 1 are coded in two adjacent bit cells selected by the first word line WL1, the source of the first cell transistor n31 is connected to the first virtual grounding line VGND1. Also, when data 0, 0 are coded in two adjacent bit cells selected by the second word line WL2, the source of the second cell transistor n32 is connected to the grounding-line GND.

With regard to the operation of the one column bit memory cell structure illustrated in FIG. 3, initially, the logic values of the bit line BL and the first and second virtual grounding lines VGND1, VGND2 are "high" and the logic value of the grounding line GND is "low." When the logic value of the first word line WL1 is "high" and the logic value of the first virtual grounding line VGND1 is changed from "high" to "low," the first cell transistor n31 is turned on and a discharge path is then formed from the bit line BL to the first virtual grounding line VGND1. As a result, the logic value of the bit line BL changes from "high" to "low" via the first cell transistor n31 and this logic "low" value can be read through a circumferential circuit(s). Thus, a logical "0" value may be coded in a bit cell selected by the first word line WL1 and the first virtual grounding line VGND1 by the connection of the first cell transistor n31 to the first virtual grounding line VGND1.

When the first word line WL1 is "high" and the logic value of the second virtual grounding line VGND2 is changed from "high" to "low," the first cell transistor n31 is turned on, but both the logic values of the first virtual grounding line VGND1 and the bit line BL are "high." Therefore, the logic value of the bit line is output and read as a logical "1," which is coded in a bit cell selected by the first word line WL1 and the second virtual grounding lie VGND2, is output and read. Thus, by connecting the source of the first cell transistor n31 to VGND1, the value of 0,1 is coded into the bit cells accessed by WL1. Alternatively, by connecting the source of the first cell transistor n31 to VGND2, the value of 1,0 may be coded into the bit cells accessed by WL1.

With regard to the bit cells accessed by the second word line WL2, when the second word line WL2 is "high" and the logic value of the first virtual grounding line VGND1 is changed from "high" to "low," the second cell transistor n32 is turned on and a discharge path is then formed from the bit line BL to the grounding line GND. As a result, the logic value of the bit line BL is discharged from "high" to "low" via the second cell transistor n32 and this logic "low" value can be read through the circumferential circuit(s). Thus, a logical "0" value may be coded in a bit cell selected by the second word line WL2 and the first virtual grounding line VGND1 by the connection of the second cell transistor n32 to the grounding line GND.

If the logic value of the second word line WL2 is "high" and the logic value of the second virtual grounding line VGND2 is changed from "high" to "low," the second cell transistor n32 is turned on and a discharge path is then formed from the bit line BL to the grounding line GND. As a result, the logic value of the bit line BL is discharged from "high" to "low" via the second cell transistor n32 and this logic "low" value can be read through the circumferential circuit(s). Thus, a logical "0" value may be coded in a bit cell selected by the second word line WL2 and the first virtual grounding line VGND2 by the connection of the second cell transistor n32 to the grounding line GND.

FIG. 4 shows a one-column bit memory cell structure of a metal (or via) programmable ROM according to embodiments of the present invention, in which data 0, 0 are coded in two adjacent bit cells selected by the first word line WL1, and data 0, 0 are coded in two adjacent bit cells selected by the second word line WL2. Referring to FIG. 4, when data 0, 0 are coded in two adjacent bit cells selected by the first word line WL1, the source of the first cell transistor n31 is connected to the grounding line GND, and when data 0, 0 are coded in two adjacent bit cells selected by the second word line WL2, the source of the second cell transistor n32 is connected to the grounding line GND.

FIG. 5 shows a one-column bit memory cell structure of a metal (or via) programmable ROM according to the present invention, in which data 1, 1 are coded in two adjacent bit cells selected by the first word line WL1, and data 1, 1 are coded in two adjacent bit cells selected by the second word line WL2. Referring to FIG. 5, when data 1, 1 are coded in two adjacent bit cells selected by the first word line WL1, the source of the first cell transistor n31 is floated, and when data 1, 1 are coded in two adjacent bit cells selected by the second word line WL2, the source of the second cell transistor n32 is floated. Here, the sources of the floated first and second cell transistors n31 and n32 may function like an antenna, thus causing noise. For this reason, in order to prevent noise, the sources of the first and second cell transistors n31 and n32 can be connected to the bit line BL.

The operations of the one-column memory cells shown in FIGS. 4 and 5 are based on the same principle as that of the one-column memory cell shown in FIG. 3. Therefore, a detailed explanation thereof will be omitted here. However, in summary, the connection of a source of one of the transistors n31 or n32 to VGND1 establishes the data as 0,1 where 0 is the value of the bit line BL when VGND1 is low and 1 is the value of the bit line when VGND2 is low and where VGND1 and VGND2 are a logical low value when the corresponding bit is read using the bit line BL. Similarly, the connection of a source of one of the transistors n31 or n32 to VGND2 establishes the data as 1,0 where 1 is the value of the bit line BL when VGND1 is low and 0 is the value of the bit line when VGND2 is low and where VGND1 and VGND2 are a logical low value when the corresponding bit is read using the bit line BL. Connection of a source of one of the transistors n31 or n32 to the grounding line GND sets the data as 0,0 and connection of a source of one of the transistors n31 or n32 to the bit line BL or if the source of one of the transistors n31 or n32 is left floating, then the data is set to 1,1. Thus, a bit cells may utilizing a single transistor for both bit values.

Figure 6:
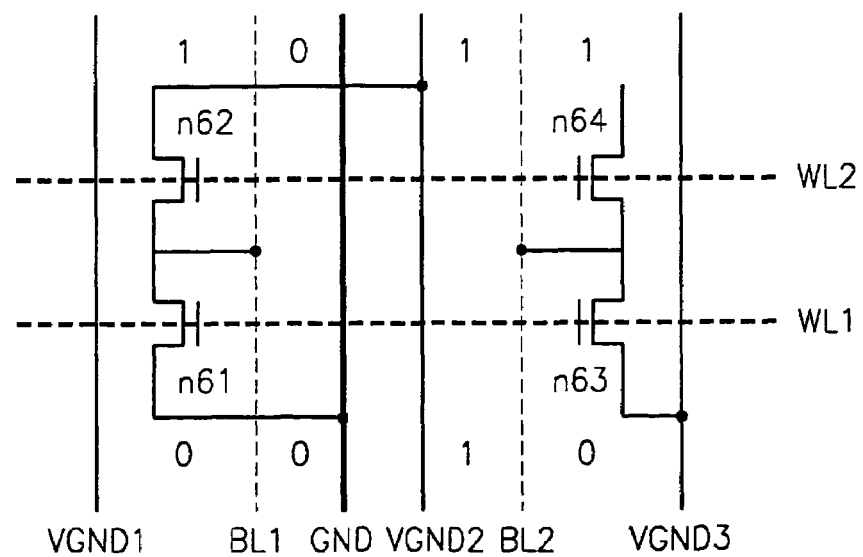
FIGS. 6 through 8 illustrate two-column bit memory cell structures of a metal (or via) programmable ROM according to embodiments of the present invention.
Figure 7:
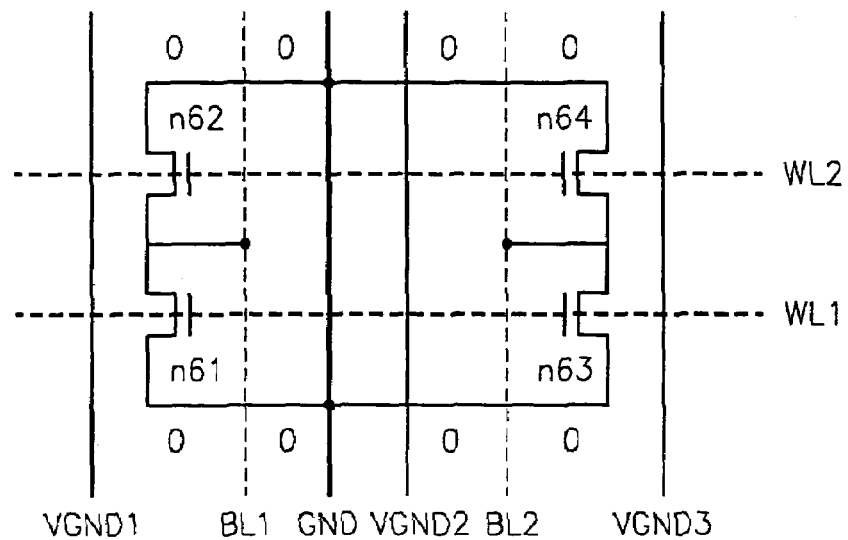
Figure 8:
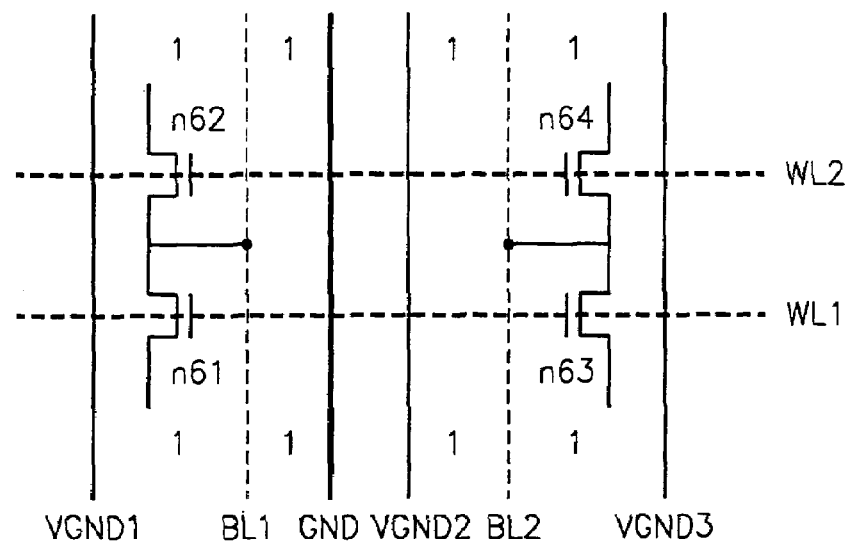

FIGS. 6 through 8 are views of two-column bit memory cells of a metal (or via) programmable ROM according to embodiments of the present invention. The two-column bit memory cell structures shown in FIGS. 6 through 8 include first and second word lines WL1 and WL2, first and second bit lines BL1 and BL2, first through third virtual grounding lines VGND1, VGND2 and VGND3, a grounding line GND and first through fourth NMOS cell transistors n61 through n64.

The drain and gate of the first cell transistor n61 are connected to the first bit line BL1 and the first word line WL1, respectively, and the drain and gate of the second cell transistor n62 are connected to the first bit line BL1 and the second word line WL2, respectively. Further, the drain and gate of the third cell transistor n63 are connected to the second bit line BL2 and the first word line WL1, respectively and the drain and gate of the fourth cell transistor n64 are connected to the second bit line BL2 and the second word line WL2, respectively.

The source of the first cell transistor n61 is floated or, alternatively, connected to any one of the first virtual grounding line VGND1, the second virtual grounding line VGND2 and/or the grounding line GND, depending on data selected by the first word line WL1 that are coded in two adjacent bit cells. On the other hand, the source of the second cell transistor n62 is floated or, alternatively, connected to any one of the first virtual grounding line VGND1, the second virtual grounding line VGND2 and/or the grounding line GND, depending on data that are coded in two adjacent bit cells selected by the second word line WL2.

The source of the third cell transistor n63 is floated or, alternatively, connected to any one of the second virtual grounding line VGND2, the third virtual grounding line VGND3 and/or the grounding line GND, depending on data that are coded in two adjacent bit cells selected by the first word line WL1. The source of the fourth cell transistor n64 is floated or, alternatively, connected to any one of the second virtual grounding line VGND2, the third virtual grounding line VGND3 and/or the grounding line GND, depending on data that are coded in two adjacent bit cells selected by the second word line WL2.

That is, the first cell transistor n61 is shared by both by a bit cell selected by the first word line WL1 and the first virtual grounding line VGND1 and a bit cell selected by the first word line WL1 and the second virtual grounding line VGND2. The second cell transistor n62 is shared by both a bit cell selected by the second word line WL2 and the first virtual grounding line VGND1 and a bit cell selected by the second word line WL2 and the second virtual grounding line VGND2.

The third cell transistor n63 is shared by both a bit cell selected by the first word line-WL1 and the second virtual grounding line VGND2 and a bit cell selected by the first word line WL1 and the third virtual grounding line VGND3. The fourth cell transistor n64 is shared by both a bit cell selected by the second word line WL2 and the second virtual grounding line VGND2 and a bit cell selected by the second word line WL2 and the third virtual grounding line VGND3.

FIG. 6 shows a two-column memory cell structure of a metal programmable ROM according to embodiments of the present invention, in which data 0, 0, 1, 0 are coded in adjacent four bit cells selected by the first word line WL1 and data 1, 0, 1, 1 are coded in adjacent four bit cells selected by the second word line WL2.

Referring to FIG. 6, when data 0, 0, 1, 0 are coded in adjacent four bit cells selected by the first word line WL1, the source of the first cell transistor n61 and the source of the third cell transistor n63 are connected to the grounding line GND and the third virtual grounding line VGND3, respectively. Also, if data 1, 0, 1, 1 are coded in adjacent four bit cells selected by the second word line WL2, the source of the second cell transistor n62 is connected to the second virtual grounding line VGND2 and the source of the fourth cell transistor n64 is floated or connected to the second bit line BL2.

FIG. 7 shows a two-column memory cell structure of a metal programmable ROM according to embodiments of the present invention, in which data 0, 0, 0, 0 are coded in four adjacent bit cells selected by the first word line WL1 and data 0, 0, 0, 0 are coded in four adjacent bit cells selected by the second word line WL2.

Referring to FIG. 7, when data 0, 0, 0, 0 are coded in four adjacent bit cells selected by the first word line WL1, the sources of the first cell transistor n61 and the third cell transistor n63 are connected to the grounding line GND. Also, when data 0, 0, 0, 0 are coded in four adjacent bit cells selected by the second word line WL2, the source of the second cell transistor n62 and the source of the fourth cell transistor n64 are connected to the grounding line GND.

FIG. 8 shows a two-column memory cell structure of a metal programmable ROM according to embodiments of the present invention, in which data 1, 1, 1, 1 are coded in four adjacent bit cells selected by the first word line WL1 and data 1, 1, 1, 1 are coded in four adjacent bit cells selected by the second word line WL2.

Referring to FIG. 8, when data 1, 1, 1, 1 are coded in four adjacent bit cells selected by the first word line WL1, the sources of the first and third cell transistors n61 and n63 are all floated or, alternatively, connected to their respective bit lines BL1 and BL2. Also, when data 1, 1, 1, 1 are coded in four adjacent bit cells selected by the second word line WL2, the sources of the second and fourth cell transistor n62 and n64 are all floated or, alternatively, connected to their respective bit lines BL1 and BL2.

The floated sources of the first through fourth cell transistors n62 through n64 may function as an antenna, thus causing noise. Thus, as described above, alternatively, the sources of the first and second cell transistors n61 and n62 can be connected to the first bit line BL1, and the sources of the third and fourth cell transistors n63 and n64 can be connected to the second bit lines BL2.

The operations of the two-column memory cells of a metal programmable ROM shown in FIGS. 6 through 8 are based on the same principle as that of the one-column memory cell in FIG. 3. Therefore, a detailed explanation thereof will be omitted here. However, as will be appreciated by one of skill in the art in light of the present disclosure, the selective connection of the transistors of the bit cells may be made to provide any desired combination of bits coded into the bit cells.

In the above-described memory cell structures of a metal programmable ROM according to the present invention, one cell transistor is shared both by two adjacent bit cells selected by the same word line and, thus, may have the same level of memory integration as in a diffusion programmable ROM. Further, a loaded capacitance of a bit line may be reduced over conventional metal programmable ROMs, thereby enhancing reading speed and reducing power consumption.

As described above, preferred embodiments of a memory cell structure of a metal programmable ROM are explained with regard to the drawings. Although only one-column and two-column bit memory cell structures are described above, a memory cell structure having four or more columns can also be created. That is, while the present invention has been particularly shown and described with reference to the preferred embodiments thereof, the present invention is not restricted to the above embodiments. Further, it will be understood by those skilled in the art that various changes in form and details may be made without departing from the spirit and scope of the invention as defined by the appended claims. Accordingly, the right scope for which the present invention is sought must be determined based on the technical idea of the appended claims.

The invention claimed is:

1. A memory cell structure of a metal programmable ROM, comprising:
    a word line;
    a bit line;
    first and second virtual grounding lines;
    a cell transistor having a first side connected to the bit line, wherein the cell transistor provides a first bit cell selected by signals of the word line and the first virtual grounding line and a second bit cell selected by signals of the word line and the second virtual grounding line.

2. The memory cell structure of claim 1, further comprising a grounding line.

3. The memory cell structure of claim 2, wherein a second side of the cell transistor is selectively floated or connected to one of the first virtual grounding line, the second virtual grounding line and/or the grounding line, and the gate of the cell transistor is connected to the word line.

* * * * *